United States Patent

[11] 3,549,950

[72] Inventor William L. Shelden
Moorestown, N.J.
[21] Appl. No. 797,785
[22] Filed Feb. 10, 1969
[45] Patented Dec. 22, 1970
[73] Assignee National Metalcrafters, Inc.
Philadelphia, Pa.
a corporation of Pennsylvania

[54] PRINTED CIRCUIT BOARD HOLDER

1 Claim, 5 Drawing Figs.

[52] U.S. Cl. .......... 317/101
[51] Int. Cl. .......... H05k 5/02, H02b 1/04
[50] Field of Search .......... 317/119, 317/101; 312/183.4; 339/17.65

[56] References Cited

UNITED STATES PATENTS 3,098,177 7/1963 Bleier .......... 317/101
3,197,731 7/1965 Beale .......... 317/101X
3,258,650 6/1966 Fiege .......... 317/101
3,333,156 7/1967 Weisman .......... 317/101

OTHER REFERENCES

PRODUCT ENGINEERING PUBLICATION May 27, 1963 classed 399/65
PRODUCT ENGINEERING PUBLICATION June 10, 1963 classed 317/101

*Primary Examiner*—Lewis H. Myers
*Assistant Examiner*—Gerald P. Tolin
*Attorney*—Seidel, Gonda & Goldhammer

ABSTRACT: A printed circuit board holder is provided wherein a circuit board has its opposite edges connected to the holder by means of retainers. The retainers are preferably made of plastic and are removable and connected at their ends to the holder or housing. The retainers may have a friction fit with the circuit board or may permit a slight degree of play between the board and the retainers. The retainers provide a floating support for better reliability in making an electrical connection between the circuit board and related connectors.

INVENTOR
WILLIAM L. SHELDEN
BY
Seidel & Gonda
ATTORNEYS.

INVENTOR
WILLIAM L. SHELDEN
BY
Seidel & Gonda
ATTORNEYS.

PRINTED CIRCUIT BOARD HOLDER

This invention relates to a printed circuit board holder comprising a housing constructed of rigid lightweight metal such as aluminum.

Most conventional circuit board holders provide fixed slots or guides for guiding circuit boards into their respective connectors. The connectors are usually mounted on connector mounting straps. The connector mounting straps are usually secured to the circuit board holder.

It has been found that when the connectors are fixed, the circuit boards could cause damage to the connectors should there be a slight misalignment between the circuit board and the connectors. Expensive and cumbersome means have been devised to permit the connectors to be secured to the mounting straps by a floating mounting.

It is an object of the present invention to provide a printed circuit board holder which utilizes retainers of a floating construction providing for a limited amount of play to permit the circuit board to be properly engaged by fixed connectors. It is another object of the present invention to provide a circuit board holder having inexpensive rigid polymeric plastic retainers.

Other objects will appear hereinafter.

The above and other objects are accomplished by the present invention. The circuit board holder includes a housing constructed of a rigid lightweight metal. Opposite sides of the housing are provided with upper and lower retainer supports. Each retainer support is provided with a series of aligned openings or apertures. Circuit board retainers are removably mounted on the supports.

Each circuit board retainer is comprised of an elongated body having a channel for receiving an edge portion of a circuit board. One end of the retainer body has an integral one-piece tongue adapted to enter an aperture on one of the retainer supports. The other end of the body is provided with a resilient metal clip having an integral one-piece tongue adapted to snap into an opening in the other retainer support. The retainer body is preferably made from a rigid polymeric material.

For the purpose of illustrating the invention, there is shown in the drawings a form which is presently preferred; it being understood, however, that this invention is not limited to the precise arrangements and instrumentalities shown.

Referring to the drawing in detail, wherein like numerals indicate like elements, there is shown in FIG. 1 a printed circuit board holder of the present invention designated generally as 10, and adapted to receive circuit boards designated generally as 12.

Figures 1, 5:
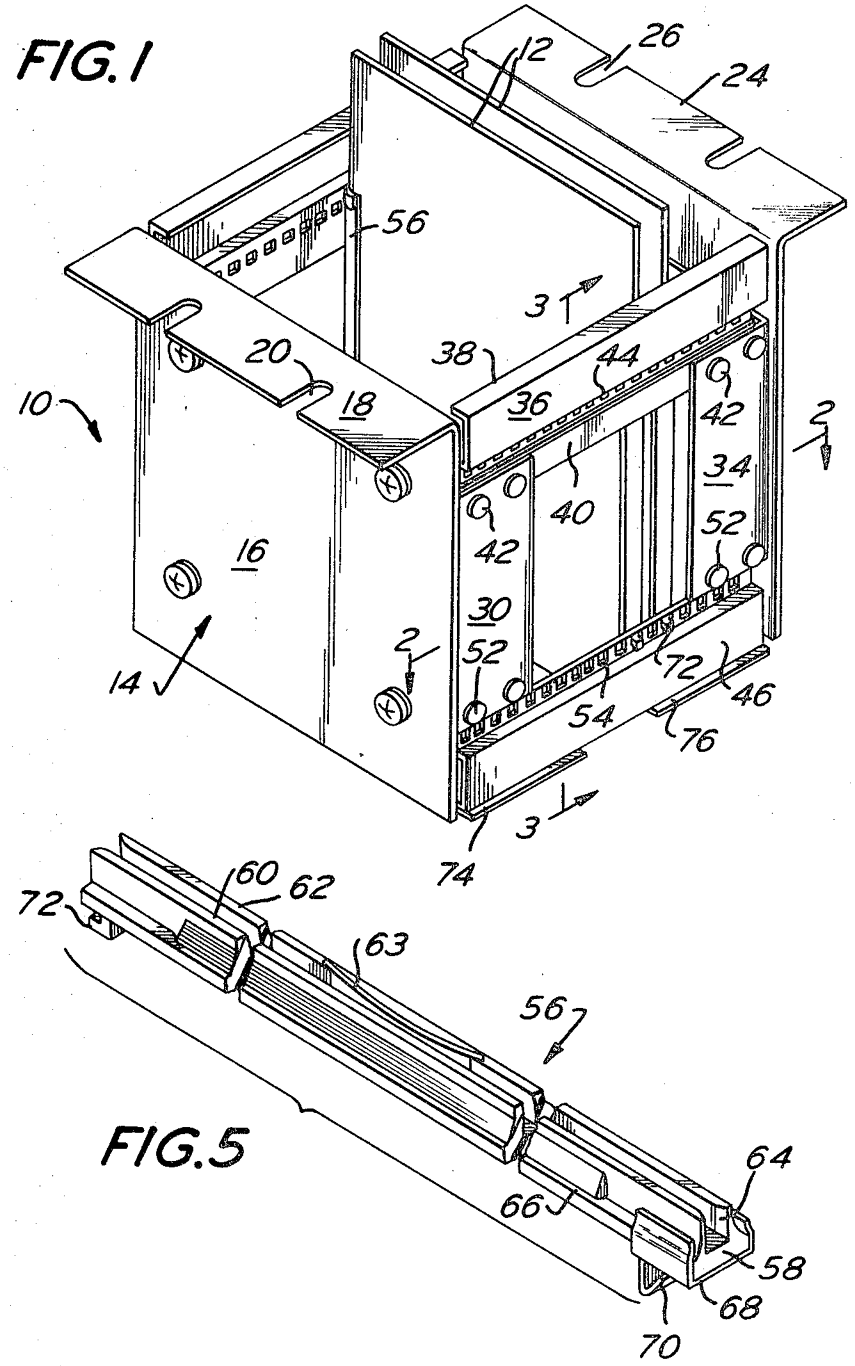
FIG. 1 is a perspective view of the printed circuit board holder of the present invention.
FIG. 5 is a perspective view of the retainer.

The printed circuit board holder 10 includes a housing designated generally as 14. The housing 14 is open at the top and bottom. Housing 14 includes an end wall 16 having a horizontally disposed flange 18 at its upper end. The free edge of flange 18 is provided with U-shaped notches 20 at spaced points therealong.

The housing 14 includes an end wall 22 having a horizontally disposed flange at its upper end. The free edge of flange 24 is provided with U-shaped notches 26 at spaced points therealong. End walls 16 and 22 are identical. The notches 20 and 26 are adapted to receive mounting bolts (not shown) to allow the holder 10 to be secured to a cabinet structure or other support means (not shown).

Figure 2:
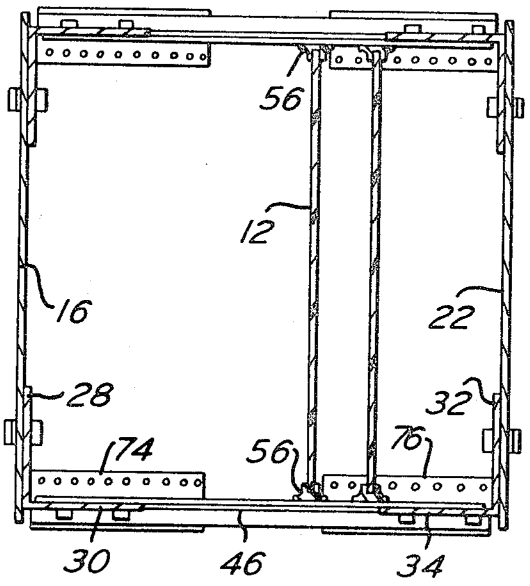
FIG. 2 is a sectional view taken along the line 2–2 in FIG. 1.

The sidewalls interconnecting the end walls 16 and 20 are identical. Hence, only one sidewall will be described in detail. Referring to FIGS. 1 and 2, a vertically disposed angle member is provided having one leg 28 overlying and riveted to end wall 16. The other leg of the angle member is designated as 30. A similar leg is designated 34.

An upper retainer support 36 is fixedly connected to the angle retainer legs 30 and 34 by means of rivets 42. Support 36 has a length which is less than the distance between end walls 16 and 22 and is connected only to the legs 30 and 34. The upper end of support 36 has an inwardly directed flange 38 lying in the plane of flanges 18 and 24.

The support 36 has a downwardly extending offset leg 40. The rivets 42 are connected to leg 40. A lower retainer support 46 is provided. Support 46 is identical with support 36 but reversed 180°. Thus, support 46 has its inwardly directed flange 48 on its lower edge.

The support 46 has an offset upwardly directed leg 50. Leg 50 is riveted to the angle member legs 30 and 34 by means of rivets 52. Leg 50 is provided with a series of rectangular openings 54 mating with a similar set of rectangular openings 44 in the leg 40 thereabove.

The circuit boards 12 are retained in the housing 14 along opposite edges by means of retainers designated generally as 56. As shown more clearly in FIG. 5, the retainer includes an elongated body 58 of a rigid polymeric plastic material. Body 58 has a pair of spaced parallel ribs 60 and 62 of reduced thickness, thereby defining a channel 64. Rib 60 along its surface adjacent channel 64 is provided with a recess within which may be disposed a bowed spring 63. Spring 63 is flattened as the circuit board 12 is inserted longitudinally down the channels 64 on oppositely disposed retainers 56. Spring 63 permits the board 12 to be tightly held by oppositely disposed retainers 56. Spring 63 may be eliminated without departing from the spirit and scope of this invention.

Along its side edges, the retainer body 58 is provided with a longitudinally extending shoulder 66. A metal mounting clip 68 is snapped over the shoulder 66. The retainer body 58 has a recess 67 on the wall intermediate ribs 60 and 62 which cooperates with a boss 69 on the clip 68 to insure a positive interengagement between the clip 68 and the shoulder 66. Clip 68 is made of spring metal and has an integral one-piece tongue 70 bent back on itself. At the opposite end of the retainer body 58, there is provided an integral one-piece L-shaped tongue 72.

Figure 3:
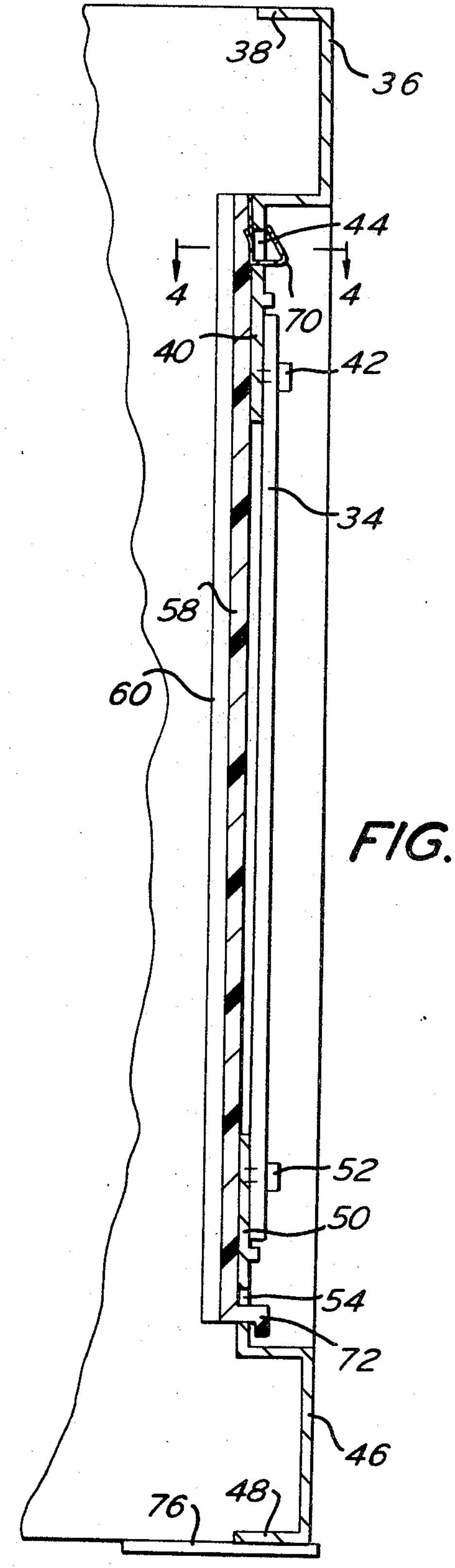
FIG. 3 is a sectional view taken along the line 3–3 in FIG. 1.
Figure 4:
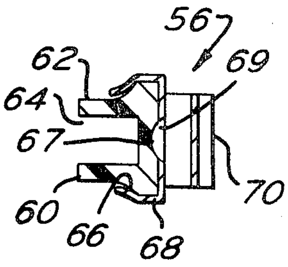
FIG. 4 is a sectional view taken along the line 4–4 in FIG. 3.

The tongue 72 on the retainer 56 is first inserted through one of the openings 54. Thereafter, the tongue 70 is inserted through a mating opening 44. It will be noted that the opening 54 is of a sufficient size so as to provide for a limited amount of play. The retainers 56 are free-floating or self-accommodating in that they can move slightly to the right or left as determined by the relative dimensions of the openings 44 and 54 with respect to the relative dimensions of the tongues 70 and 72 respectively. Tongue 72 is narrower than the width of the opening 54 by a distance of approximately .04 inches. Tongue 70 is slightly wider than tongue 72 and is narrower than the width of opening 44 by a distance of approximately .02 inches. The tongue 72 projects beyond the juxtaposed surface of the leg 50 by a distance of approximately .02 inches as shown more clearly in FIG. 3. Tongue 72 is inserted through opening 54 so that maximum play for the board 12 will be provided at the lowermost end of the holder 10 where the fixed connectors will be located. The tongues 70 and 72 could be inserted through the openings 54 and 44 respectively. However, in the latter arrangement the play will be less and therefore it is preferred that tongues 70 and 72 be inserted through openings 44 and 54, respectively.

Perforated connector mounts 74 and 76 are fixedly secured to the flange 48 in any convenient manner such as by riveting or welding.

A method of using a circuit board such as that described above is well known to those skilled in the art and need not be described in further detail.

The present invention may be embodied in other specific forms without departing from the spirit or essential attributes thereof and, accordingly, reference should be made to the appended claims, rather than to the foregoing specification as indicating the scope of the invention.

I claim:

1. A printed circuit board holder comprising a housing, said housing being open at one end and including opposed means each of which defines a plurality of sets of spaced first and second openings; at least two opposed circuit board retainers comprising substantially rigid elongated members; an outwardly projecting, substantially rigid tongue coupled to one end of each of said opposed members, said tongue being received in one of said openings in one of said sets; a resilient spring clip member having an outwarldly projecting portion coupled to another end of each of said opposed members; said resilient spring clip member being received in the other opening in said sets for resiliently engaging one of said opposed means; said resilient spring clip member including a boss, a recess formed in one end of said rigid elongated member, and said boss being received in said recess to prevent inadvertent removal of said resilient spring clip member from said body; and said first and second openings in each of said sets being slightly larger than said tongue and said resilient member to permit relative movement between said retainers and said housing when a circuit board is inserted in said retainers.